United States Patent [19]
Marohl et al.

[11] Patent Number: 6,034,863
[45] Date of Patent: *Mar. 7, 2000

[54] APPARATUS FOR RETAINING A WORKPIECE IN A PROCESS CHAMBER WITHIN A SEMICONDUCTOR WAFER PROCESSING SYSTEM

[75] Inventors: Dan A. Marohl, San Jose; Jeffrey A. Brodine, Los Gatos; Tony P. Schiavo, Jr., San Mateo, all of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/968,217

[22] Filed: Nov. 12, 1997

[51] Int. Cl.[7] .................................................. H02N 13/00
[52] U.S. Cl. ........................................... 361/234; 279/128
[58] Field of Search ................................. 361/230–235; 279/128

[56] References Cited

U.S. PATENT DOCUMENTS

| | | | |
|---|---|---|---|
| 4,645,218 | 2/1987 | Ooshio et al. | 361/234 |
| 5,320,982 | 6/1994 | Tsubone et al. | 361/233 |
| 5,421,401 | 6/1995 | Sherstinsky et al. | 165/80.2 |
| 5,532,903 | 7/1996 | Kendall | 361/234 |
| 5,671,117 | 9/1997 | Sherstinsky et al. | 361/234 |
| 5,805,408 | 9/1998 | Maraschin et al. | 361/234 |

*Primary Examiner*—Fritz Fleming
*Attorney, Agent, or Firm*—Thomason Moser &Patterson

[57] ABSTRACT

Apparatus for retaining a workpiece in a process chamber of a semiconductor wafer processing system. The apparatus has a thermal transfer element, an electrostatic chuck on top of the thermal transfers element and a clamping ring that secures the chuck to the thermal transfer element in a predefined orientation. The detachable, "keyed" chuck permits rapid exchange of wafer support platforms for increased productivity and consistent placement of same upon the thermal transfer element for reliable processing conditions.

28 Claims, 4 Drawing Sheets

APPARATUS FOR RETAINING A WORKPIECE IN A PROCESS CHAMBER WITHIN A SEMICONDUCTOR WAFER PROCESSING SYSTEM

BACKGROUND OF THE INVENTION

1. Field of the Invention

The invention relates generally to an apparatus for retaining a workpiece on a workpiece support within a semiconductor wafer processing system and, more specifically, to an improved three piece puck and pedestal base assembly for supporting and retaining large diameter (300 mm or more) semiconductor wafers.

2. Description of the Background Art

Electrostatic chucks are used for holding a workpiece in various applications ranging from holding a sheet of paper in a computer graphics plotter to holding a wafer within a semiconductor wafer process chamber. Electrostatic chucks typically clamp a workpiece (i.e., a semiconductor wafer) by creating an electrostatic attractive force between the wafer and the chuck. A voltage is applied to one or more electrodes in the chuck so as to induce oppositely polarized charges in the wafer and electrodes, respectively. The opposite charges pull the wafer against the chuck, thereby retaining the wafer.

A diameter of 200 mm is an accepted industry standard for semiconductor wafers. In semiconductor wafer processing equipment, electrostatic chucks are commonly used for clamping 200 mm wafers to a pedestal during processing. For example, in a physical vapor deposition (PVD) chamber 400 such as that depicted in FIG. 4, a 200 mm wafer 402 is electrostatically clamped to a pedestal assembly 404 to ensure that the wafer is stationary during processing. To enhance some PVD processes, the pedestal assembly 404 has a thermal transfer element 406 disposed below an electrostatic chuck 412 to regulate the temperature of the wafer to facilitate efficient processing. Increased demand for 200 mm wafers led to improvements in chuck construction and features for processing this size workpiece. This resulted in higher wafer yield, better temperature control during wafer processing and an overall better quality product.

The latest generation of semiconductor wafers have diameters of 300 mm to accommodate fabrication of even more integrated circuit components on a single wafer. Unfortunately, the larger size wafers carry with them their own set of production problems. For example, wafer processing temperatures can reach as high as 500° C. As such, a larger thermal transfer element is required to provide adequate heating of a 300 mm wafer during processing. Additionally, maintaining adequate and uniform thermal conductivity between the thermal transfer element and the backside of the wafer is essential. One-piece thermal transfer element/chuck units are adequate for processing of 200 mm wafers, but may not be suitable for processing their larger successors. When such one-piece units fail or the ceramic chuck portion cracks from fatigue or excessive thermal expansion, the entire unit must be replaced. This type of repair is usually expensive and time consuming.

One solution is to develop a two-piece assembly whereby the chuck and thermal transfer element are individual components. In two piece assemblies, the chuck portion resembles a disk-like portion and is commonly referred to as a puck. Usually the puck and thermal transfer element are fabricated from different materials (i.e., a ceramic puck and a stainless steel thermal transfer element). As such, these materials are joined together by brazing. Under wafer processing conditions, the braze joint often releases contaminants into a process chamber (a condition known as outgassing) which is undesirable. Additionally, at extreme operating temperatures, differential thermal expansion of pedestal components occur. Specifically, a ceramic puck will expand only half as much as a similarly sized stainless steel (SST) part. The portion of the deposition ring (or similar type device) that contacts the expanding ceramic will tend to grind or scratch the ceramic thereby releasing particles into the chamber. These particles can contaminate a wafer under process, equipment within the chamber, or be carried to other chambers or wafers. As such, defective units rise disproportionately to the total number of produced units.

Therefore, there is a need in the art for an improved two-piece puck and thermal transfer element assembly and an apparatus for joining the puck to a thermal transfer element assembly. Such devices are necessary to improve temperature uniformity across a wafer and reduce maintenance and manufacturing costs of same.

SUMMARY OF THE INVENTION

The disadvantages heretofore associated with the prior art are overcome by an improved apparatus for retaining a wafer in a semiconductor wafer processing system. The inventive apparatus is a three piece pedestal assembly. Specifically, the pedestal assembly has a puck secured to a thermal transfer element via the clamping ring. The clamping ring, circumscribing the puck, is provided with a plurality of "finger" contact portions. The puck is provided with a plurality of scallop portions on its periphery. As such, each finger contact portion engages a corresponding scallop portion. One finger contact portion and one scallop portion are sized slightly differently than all other finger contact and scallop portions. In this manner, the puck is always oriented in the same position in relation to the clamp ring and thermal transfer element.

Additionally, the contact area of the finger portions are flexible and radiused.

The described components contribute to consistent physical contact and thus uniform thermal conduction between the puck and thermal transfer element, reduced microgrinding of the puck material and rapid replacement of the puck. As such, wafer processing problems such as particle generation, thermal expansion and puck failure are minimized which results in more cost effective wafer processing.

This invention fulfills the long felt need for an apparatus that can effectively retain (chuck) a large (300 mm diameter) wafer to an electrostatic chuck and provide heat transfer characteristics similar to those found in semiconductor wafer processing systems that process smaller diameter wafers.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
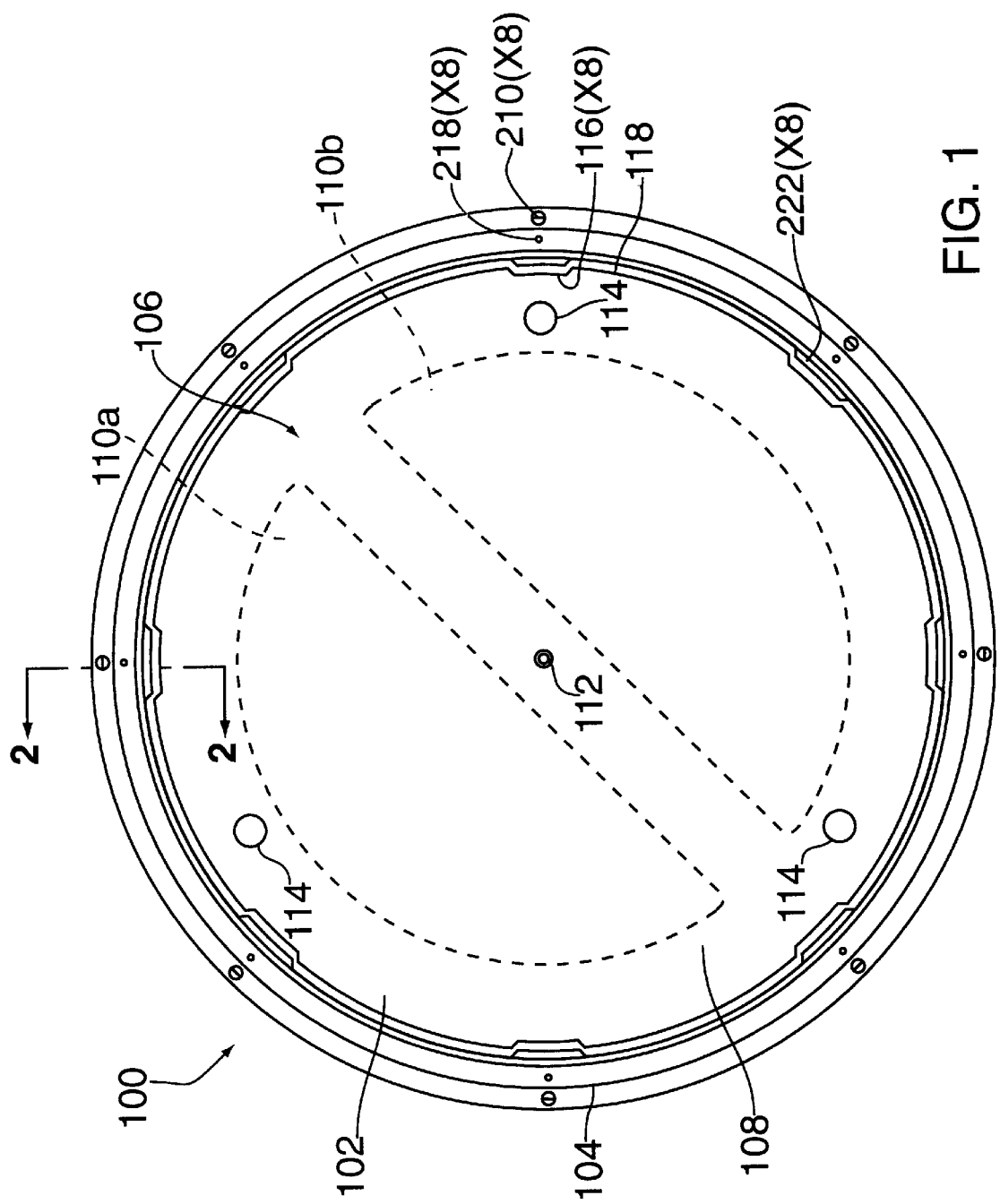
FIG. 1 depicts a top view of the inventive electrostatic puck and clamp ring.
Figure 2:
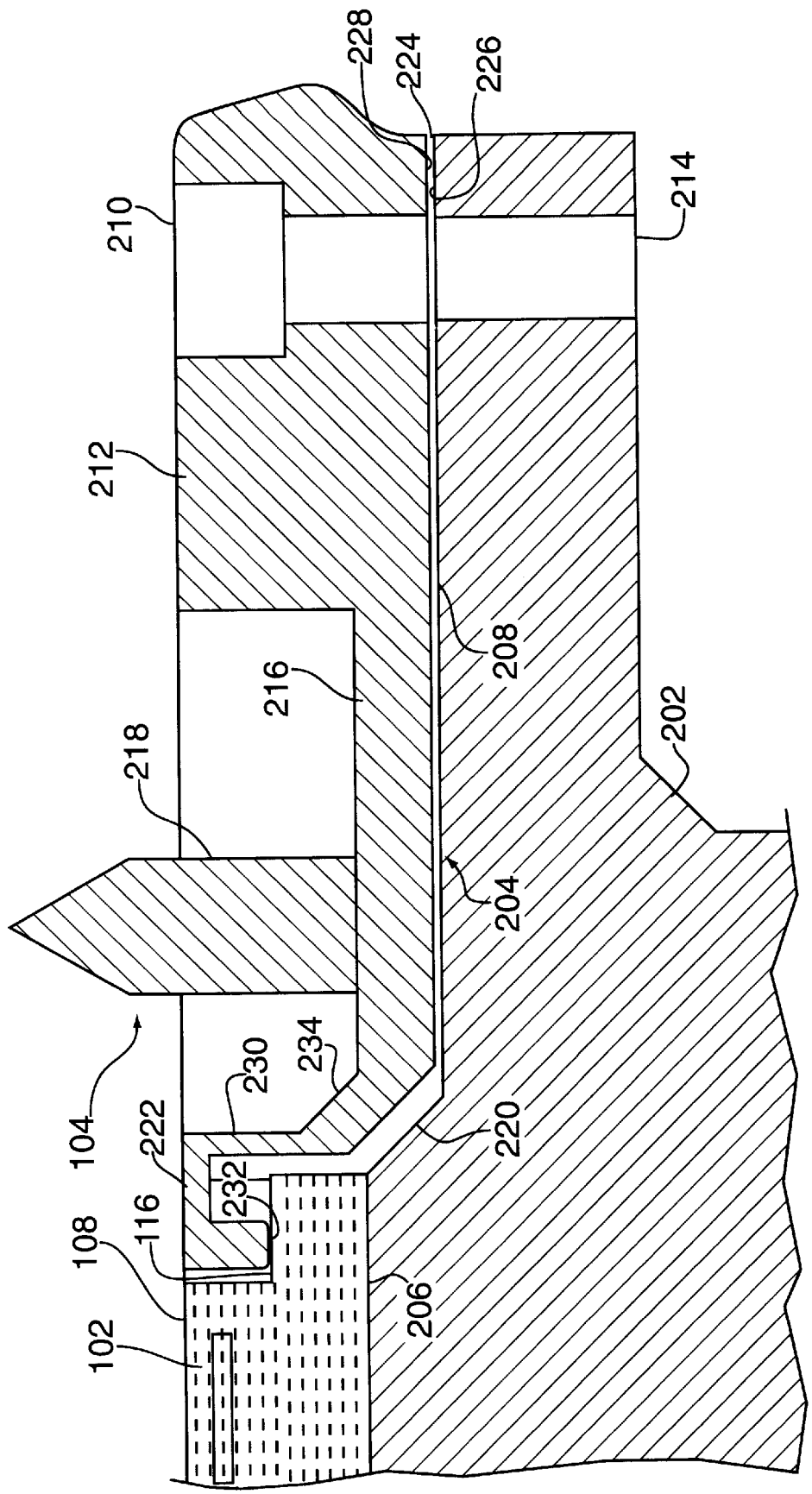
FIG. 2 depicts a detailed cross-sectional view of the puck and clamp ring secured to a pedestal thermal transfer element and as seen along lines 2—2 of FIG. 1.

For the best understanding of the subject invention, the reader should simultaneously refer to FIGS. 1 and 2 while reading the following disclosure. FIG. 1 depicts a top view of an inventive pedestal assembly 100 used in a process chamber. Specifically, in FIG. 1 a puck 102 and clamping ring 104 are depicted. The clamping ring 104 is secured to a thermal transfer element 202 (see FIG. 2) below the puck 102 and clamping ring 104. The thermal transfer element 202 is fabricated from a durable, heat conducting material such as stainless steel, titanium, or nickel-plated copper, and contains the necessary hardware to heat or cool a bottom surface of the puck 102. The inventive assembly can be used in a variety of process chambers including, but not limited to, physical vapor deposition (PVD), chemical vapor deposition CVD, ion implant, degas, cooldown and/or etch chambers for fabricating semiconductor wafers. FIG. 2 depicts a cross-sectional view of the inventive pedestal assembly as seen along lines 2—2 of FIG. 1. For a detailed understanding of a PVD reaction chamber and its operation in processing a wafer, the reader should refer to the drawings and the detailed description contained in Pat. No. 5,228,501, issued Jul. 20, 1993 incorporated herein by reference. That patent discloses a wafer support assembly used in a physical vapor deposition chamber manufactured by Applied Materials, Inc. of Santa Clara, Calif.

The puck 102 is a separate body that sits on a top surface 204 of the thermal transfer element 202 and functions as an electrostatic chuck. That is, the puck 102 contains an electrode configuration 106 which provides the necessary chucking force between a top surface 108 of the puck and the bottom surface of a workpiece (not shown) supported by the puck 102. Generally, the puck 102 has one or more electrodes 110a and 110b either embedded within the puck 102 or deposited on the top surface 108 of the puck. For example, commonly assigned U.S. patent application Ser. No. 08/871,741 filed Jun. 9, 1997 describes a variety of electrode configurations for an electrostatic chuck including but not limited to a pair of half-moon shaped, coplanar conductors and a set of concentric ring electrodes. The puck 102 is further provided with electric leads (not shown) that connect each of the electrodes 110a and 110b to a remote voltage source (not shown) below the thermal transfer element. For example, for a bipolar electrode configuration, a positive voltage is applied to the first electrode 110a and a negative voltage is applied to the second electrode 110b. The resultant electric field induces opposite polarity charges to accumulate across the surface of the puck 102 and the backside of the workpiece, thereby electrostatically clamping the workpiece to the puck.

Ideally, the puck 102 is also fabricated from a material capable of adequately transferring heat from the thermal transfer element 202 to the backside of a workpiece (not shown). As such, the workpiece (i.e., a semiconductor wafer) is heated to an operating temperature that is favorable to a PVD process. It should be noted that although the thermal transfer element and puck are both fabricated from a heat conducting material, the same material is usually not used for both components. One skilled in the art of semiconductor wafer processing and the fabrication of the machinery to accomplish same will realize that selection of the materials for each component is based on optimal performance of the component and the wafer processing system as a whole. For example, the thermal transfer element 202 may be fabricated from a metal while the puck 102 may be fabricated from a semiconductor, ceramic or composite material. In a preferred embodiment of the invention, the thermal transfer element is stainless steel and the puck is a ceramic such as aluminum nitride. Alternately, the ceramic may be alumina doped with a metal oxide such as titanium oxide (TiO2) or some other ceramic material with similar resistive properties.

To further enhance heat conduction, a heat transfer gas may be pumped into interstitial spaces between the top surface 108 of the puck 102 and the backside of the workpiece. Alternately, a heat conducting foil can be used to close the gap and thereby function as a thermal conduction medium. The gas is pumped beneath the workpiece via an inlet port 112. At the conclusion of wafer processing, power to the remote voltage source is reduced or turned off to allow "dechucking" of the workpiece. The workpiece is then lifted off the top surface 108 of the puck 102 via lift pins (not shown) below the puck so that a wafer transfer robot can retrieve the workpiece from the chamber. Specifically, lift pins inside a hermetically sealed cavity (not shown) in the thermal transfer element rise up to the top surface 108 of the puck 102 via a plurality of lift pin ports 114. In a preferred embodiment of the subject invention, one heat transfer gas port is provided in the center of the puck 102 and three lift pin ports 114 are equilaterally spaced about the center of the puck 102.

FIG. 2 depicts a detailed cross-sectional view of a portion of the inventive pedestal assembly 100. The top surface 204 of the thermal transfer element 202 contains an inner raised portion 206 circumscribed by an outer flange portion 208. A transition area 220 is defined as the area where the flange portion 208 ends and the inner raised portion 206 of the thermal transfer element 202 begins. The puck 102 sits on the raised portion 206 of the thermal transfer element 202 and is secured to the thermal transfer element via the clamping ring 104. Specifically, the clamping ring 104 covers the entire flange portion 208 of the thermal transfer element 202. The clamping ring 104 has a bore 210 through a thick outer portion 212. A similar bore 214 in the flange portion 208 of the thermal transfer element 202 is coaxial with the bore 210 through the clamping ring 104. Preferably, the bore 214 is threaded so as to accommodate a bolt (not shown) to secure the clamping ring 104 to the thermal transfer element 202.

The top surface 108 of the puck 102 is provided with a plurality of scallop sections 116 each of which meet and coincide with a corresponding finger portion 222 of the clamping ring 104. In a preferred embodiment of the invention, eight scallop sections are equilaterally spaced around a periphery 118 of the puck 102 on its top surface 108 and eight corresponding finger portions 222 are provided on the clamping ring 104. One of the eight scallop sections and its corresponding finger portion may be differently sized than the others. By way of example, scalloped section 116A and finger portion 222A are smaller than the other scallop sections 116 and finger portions 222.

Radially inward of the thick outer portion 212 is a relatively thin central portion 216. At each finger portion, the central portion 216 extends radially inward from the thick outer portion 212 to a thin wall portion 230. At the location between finger portions 222, the central portion 216 ends proximate the peripheral edge of the puck 102. However, to form each finger portion, the central portion 216 and wall portion 230 are oriented at an angle of approximately 90° and are joined by a transition portion 234. The transition portion 234 follows a contour of the transition area 220 on the top surface 204 of the thermal transfer element 202. Extending upwards from the central portion 216 is a guide pin 218. Ideally, a plurality of guide pins are equilaterally spaced about the clamping ring 104. The guide pins define an outer limit for the semiconductor wafer should it shift from its intended position on the puck 102. In other words, if the wafer were to move laterally across the puck 102 due to some wafer process anomaly (i.e., excessive backside gas pressure or loss of the chucking force), the pins will prevent such movement beyond a point where the wafer transfer robot would not be able to retrieve the wafer.

At the finger portion locations, the wall portion 230 of the clamp ring 104 is provided, which points upward and then curves to form an inverted "J" shaped finger contact portion 222. The finger contact portion 222 meets and coincides with the scalloped section 116 on the top surface 108 of the puck 102. The finger portions 222 contact and apply a downward pressure to the scallop sections 116 when the clamping ring 104 is secured to the thermal transfer element 202 via the bolts.

To ensure that the clamping ring 104 properly applies pressure to the scallop sections, the surfaces 226 and 228 are sized relative to finger portion 222 and machined in such a manner that a small gap 224 exists between a top surface 226 of the flange portion 208 and a bottom surface of the clamping ring 228 when the finger portions 222 first contact scallop sections 116. In a preferred embodiment of the invention, the width of the gap 224 is approximately 0.010 in. (25.4 mm). When a bolt (not shown) is threaded into the bores 210 and 214, the finger portions 222 of the clamping ring 104 contact and press primarily upon the scallop sections 116. This contact provides a loading force on the puck 102 to adequately load it against the thermal transfer portion without overloading the puck and thereby causing it to crack.

Figure 3:
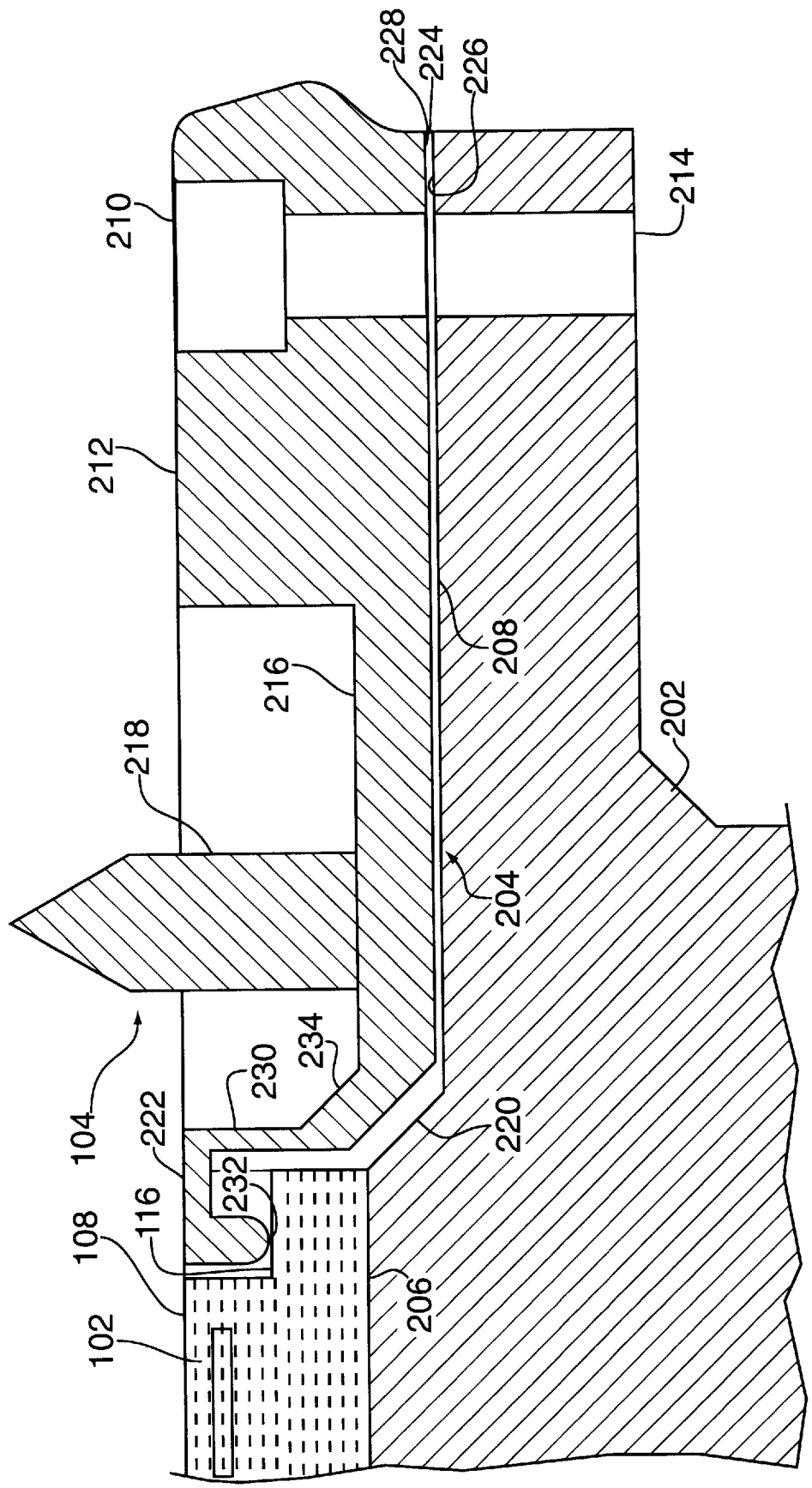
FIG. 3 depicts a cross-sectional view of a second embodiment of the clamp ring securing the puck to the pedestal thermal transfer element.
Figure 4:
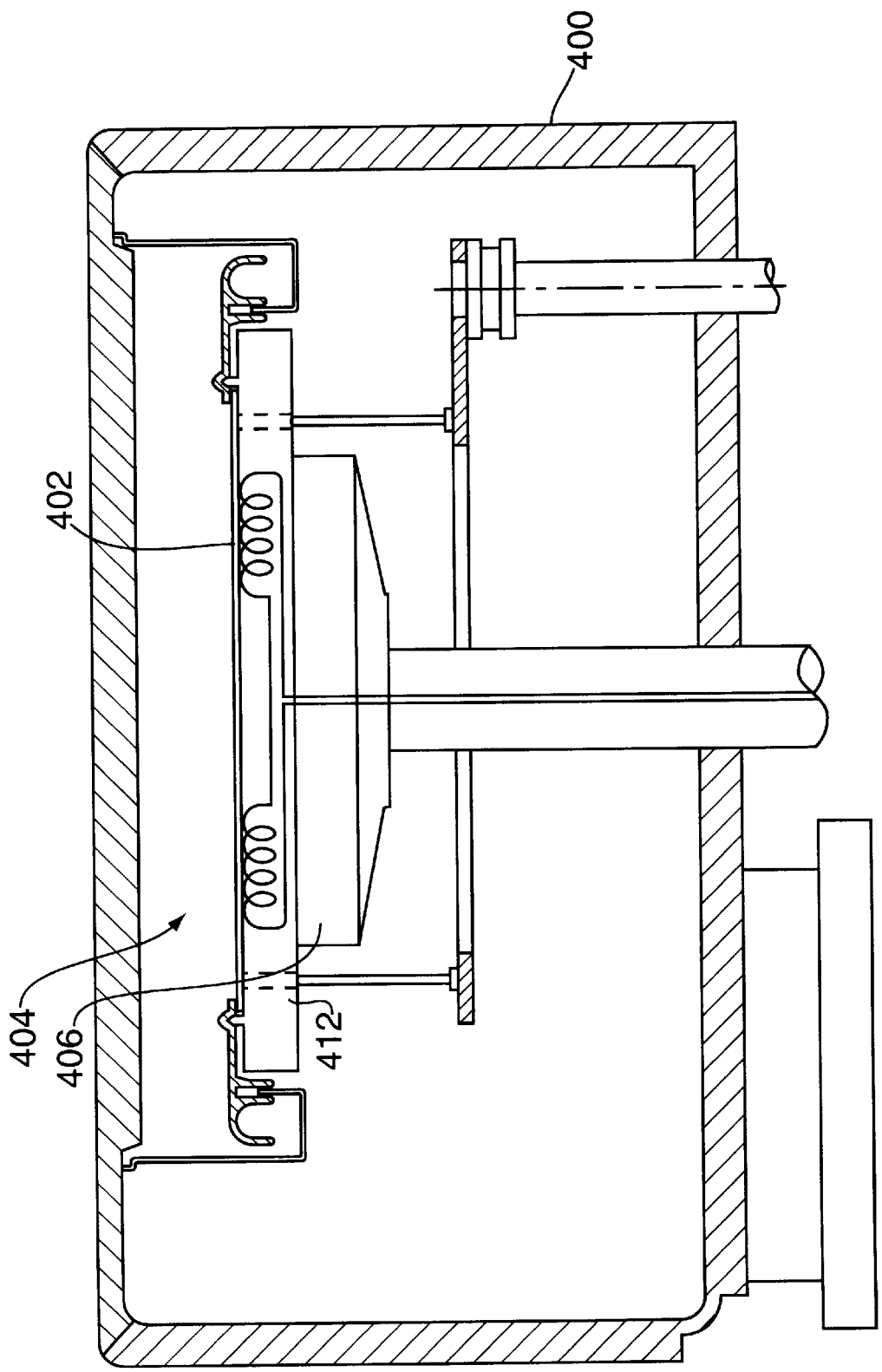
FIG. 4 depicts a prior art PVD semiconductor wafer processing chamber containing an apparatus for retaining a workpiece upon an electrostatic chuck.

One skilled in the art can readily design a variety of similar clamping ring configurations to provide the required downward force to secure the puck to the thermal transfer element. However, the general shape and proportions of the finger portion of the clamp ring disclosed in this application contain another distinct advantage. As discussed earlier, when process chamber temperatures rise, thermal expansion of pedestal assembly components occurs, causing the phenomenon of "microgrinding". The inverted "J" shaped finger portion compensates for thermal expansion by flexing instead of remaining stationary against the ceramic portion that it contacts. Specifically, the wall section 230 is designed with a predetermined thickness. This thickness is extremely thin (in the range of approximately 0.020–0.030 in. (50.8–76.2 mm) and deflects vertically under the influence of the thermally expanding puck material. As such, minimal microgrinding occurs at the puck/clamp ring interface. Additionally, the contact area 232 of the finger portion 222 has no sharp corners that can chip or fragment under thermal expansion conditions. Such corners are "radiused" to provide smooth transitions between different faces of the finger portion. FIG. 3 depicts an alternate embodiment of the invention, wherein the entire contact area 232 is "radiused" instead of just the corners. As such, as the puck expands the contract area 232 "pivots" against the puck surface to avoid microgrinding.

An additional feature of the described invention is that the scallop sections of the puck are designed such that the puck can only be installed in a predetermined orientation on the thermal transfer element. Specifically, each of the scallop sections 116 of the puck 102 are machined within a specific width and tolerance. However, one of the scallop sections is machined to be sized differently, e.g., slightly smaller, than all of the other scallop sections. Correspondingly, one of the finger portions 222 of the clamping ring 104 is fabricated slightly smaller than all the other finger portions. As such, the puck can only be installed on the thermal transfer element and secured by the clamping ring 104 by aligning the smaller scallop section with the smaller finger portion. Alternately, one of the scallop sections and corresponding finger portions may be slightly larger than all other scallop sections and finger portions. This "puck keying" feature simplifies assembly and guarantees that any puck installed on the thermal transfer element will always be properly positioned and aligned with the lift pins and the conductive contacts that couple power to the electrodes.

In sum, the subject invention provides a novel, three piece pedestal assembly for processing large (300 mm or more) semiconductor wafers. The pedestal assembly has a puck secured to a thermal transfer element via a clamping ring. The puck and clamping ring are specially designed to minimize the effects of particle generation resulting from thermal expansion and maximize thermal conduction between the puck and the thermal transfer element. The clamping ring is provided with finger portions which engage scallop portions on the puck. Additionally, one finger portion and one scallop portion are sized slightly differently then all other finger and scallop portions. As such, the puck is always oriented in the same position in relation to the clamping ring and thermal transfer element thereby ensuring consistent physical contact and thus thermal conduction with the thermal transfer element. The finger portions are flexible and radiused which reduces the likelihood of microgrinding the puck material. The detachable puck allows for rapid and inexpensive component replacement or chamber retooling such as ceramic puck change out without the need to remove a brazed or otherwise permanently joined heat transfer portion-puck assembly, which results in more cost effective wafer processing.

Although various embodiments which incorporate the teachings of the present invention have been shown and described in detail herein, those skilled in the art can readily devise many other varied embodiments that still incorporate these teachings.

What is claimed is:

1. Apparatus for retaining a workpiece in a process chamber of a semiconductor wafer processing system comprising:

a thermal transfer element having a top surface;

a puck positioned on the top surface of the thermal transfer element, said puck having a periphery and a plurality of scallop sections along said periphery; and a clamping ring, circumscribing the puck for securing the puck to the thermal transfer element.

2. The apparatus of claim 1 wherein the puck is an electrostatic chuck.

3. The apparatus of claim 2 wherein one of the plurality of scallop sections is sized differently than a remainder of the plurality of scallop sections.

4. The apparatus of claim 3 wherein the one of the plurality of scallop sections that is sized differently is smaller than the remainder of the plurality of scallop sections.

5. The apparatus of claim 4 wherein the clamping ring further comprises a plurality of finger contact portions for contacting the plurality of scallop sections.

6. The apparatus of claim 5 wherein one of the plurality of clamping ring contact portions is sized differently than a remainder of the plurality of clamping ring contact portions.

7. The apparatus of claim 6 wherein the one of the plurality of clamping ring contact portions that is sized differently is smaller than the remainder of the plurality of clamping ring contact portions.

8. The apparatus of claim 7 wherein the one of the plurality of scallop sections that is smaller than the remainder of the plurality of scallop sections and the one of the plurality of clamping ring contact portions that is smaller than the remainder of the plurality of clamping ring contact portions define a keyed orientation for securing the puck to the thermal transfer element.

9. The apparatus of claim 8 wherein the plurality of clamping ring contact portions equals the plurality of scallop sections.

10. The apparatus of claim 9 wherein the plurality of scallop sections and the plurality of clamping ring contact portions is eight.

11. The apparatus of claim 10 wherein the plurality of clamping ring contact portions further comprise inverted "J" shaped finger portions, each of the inverted "J" shaped finger portions having a contact area.

12. The apparatus of claim 11 wherein the contact area of each of the inverted "J" shaped finger portions is radiused.

13. The apparatus of claim 12 wherein each of the inverted "J" shaped finger portions further comprise a wall section having a thickness.

14. The apparatus of claim 13 wherein the thickness of the wall sections allows for flexing of the inverted "J" shaped finger portion caused by thermal expansion of the puck.

15. Apparatus for retaining a workpiece in a process chamber of a semiconductor wafer processing system comprising:
   a thermal transfer element having a top surface;
   an electrostatic chuck positioned on the top surface of the thermal transfer element, said electrostatic chuck having a periphery and a plurality of scallop sections along said periphery; and
   a clamping ring, circumscribing an electrostatic chuck for securing the electrostatic chuck to the thermal transfer element.

16. The apparatus of claim 15 wherein one of the plurality of scallop sections is sized differently than a remainder of the plurality of scallop sections.

17. The apparatus of claim 16 wherein the one of the plurality of scallop sections that is sized differently is smaller than the remainder of the plurality of scallop sections.

18. The apparatus of claim 17 wherein the clamping ring further comprises a plurality of finger contact portions for contacting the plurality of scallop sections.

19. The apparatus of claim 18 wherein one of the plurality of clamping ring contact portions is sized differently than a remainder of the plurality of clamping ring contact portions.

20. The apparatus of claim 19 wherein the one of the plurality of clamping ring contact portions that is sized differently is smaller than the remainder of the plurality of clamping ring contact portions.

21. The apparatus of claim 20 wherein the one of the plurality of scallop sections that is smaller than the remainder of the plurality of scallop sections and the one of the plurality of clamping ring contact portions that is smaller than the remainder of the plurality of clamping ring contact portions define a keyed orientation for securing the electrostatic chuck to the thermal transfer element.

22. The apparatus of claim 21 wherein the plurality of clamping ring contact portions equals the plurality of scallop sections.

23. The apparatus of claim 22 wherein the plurality of scallop sections and the plurality of clamping ring contact portions is eight.

24. The apparatus of claim 23 wherein the plurality of clamping ring contact portions further comprise inverted "J" shaped finger portions, each of the inverted "J" shaped finger portions having a contact area.

25. The apparatus of claim 24 wherein the contact area of each of the inverted "J" shaped finger portions is radiused.

26. The apparatus of claim 25 wherein each of the inverted "J" shaped finger portions further comprise a wall section having a thickness.

27. The apparatus of claim 26 wherein the thickness of the wall sections allows for flexing of the inverted "J" shaped finger portion caused by thermal expansion of the electrostatic chuck.

28. Apparatus for retaining a workpiece in a process chamber of a semiconductor wafer processing system comprising:
   a thermal transfer element having a top surface;
   an electrostatic chuck positioned on the top surface of the thermal transfer element having eight scallop sections along a periphery of the electrostatic chuck; and
   a clamping ring, circumscribing the electrostatic chuck for securing the electrostatic chuck to the thermal transfer element, the clamping ring having eight inverted "J" shaped finger portions, each finger portion having a radiused contact area wherein one of the eight scallop sections and one of the eight clamping ring finger portions are smaller than the remaining scallop sections and contact portions to define a keyed orientation for securing the electrostatic chuck to the thermal transfer element, each of the finger portions also comprising a wall section having a thickness which allows for flexing of the finger portion caused by thermal expansion of the electrostatic chuck.

* * * * *

UNITED STATES PATENT AND TRADEMARK OFFICE
CERTIFICATE OF CORRECTION

| | |
|---|---|
| PATENT NO. | : 6,034,863 |
| DATED | : March 7, 2000 |
| INVENTOR(S) | : Marohl et al. |

It is certified that error appears in the above-identified patent and that said Letters Patent is hereby corrected as shown below:

Insert 222A to figure 1 as indicated on attached copy of figure;
Insert 116A to figure 1 as indicated on attached copy of figure.

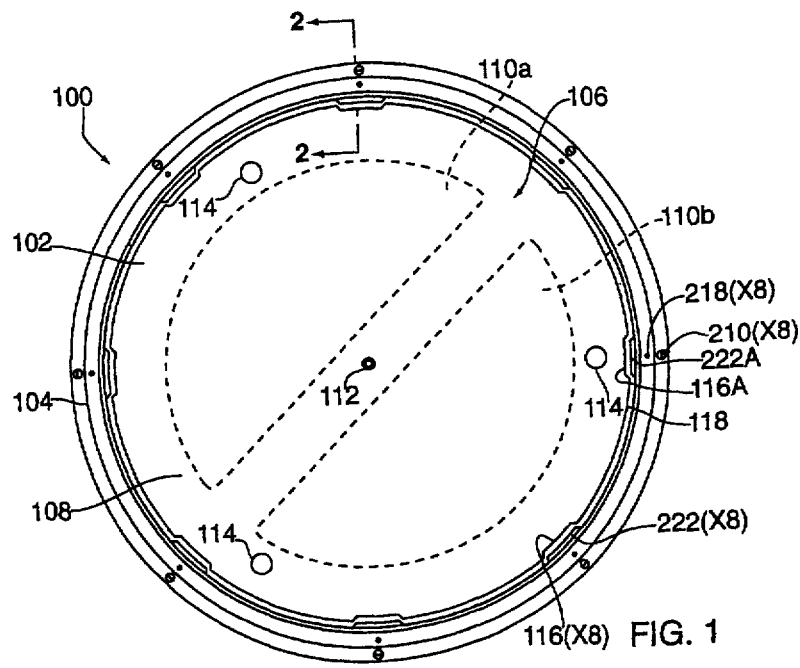

Signed and Sealed this

Sixteenth Day of October, 2001

Attest:

NICHOLAS P. GODICI
Attesting Officer    Acting Director of the United States Patent and Trademark Office